(12) United States Patent
Kim et al.

(10) Patent No.: US 9,230,951 B2
(45) Date of Patent: Jan. 5, 2016

(54) ANTISTATIC DEVICE OF DISPLAY DEVICE AND METHOD OF MANUFACTURING THE SAME

(71) Applicant: LG DISPLAY CO., LTD., Seoul (KR)

(72) Inventors: Dong Hyuk Kim, Paju- Si (KR); Dong Sun Kim, Goyang-Si (KR); Won Joon Ho, Jeonju-Si (KR); Chun Bae Lim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/575,722

(22) Filed: Dec. 18, 2014

(65) Prior Publication Data

US 2015/0187750 A1    Jul. 2, 2015

(30) Foreign Application Priority Data

Dec. 26, 2013    (KR) .................. 10-2013-0164464

(51) Int. Cl.
| | |
|---|---|
| *H01L 27/02* | (2006.01) |
| *G02F 1/1362* | (2006.01) |
| *G02F 1/1368* | (2006.01) |
| *H01L 27/12* | (2006.01) |

(52) U.S. Cl.
CPC .......... *H01L 27/0248* (2013.01); *G02F 1/1368* (2013.01); *G02F 1/136204* (2013.01); *G02F 1/136286* (2013.01); *H01L 27/1225* (2013.01); *H01L 27/1259* (2013.01)

(58) Field of Classification Search
USPC ............................................................ 257/43
See application file for complete search history.

(56) References Cited

U.S. PATENT DOCUMENTS

| | | | | |
|---|---|---|---|---|
| 2002/0153831 | A1* | 10/2002 | Sakakura ............ | H01L 27/1214 313/504 |
| 2014/0320959 | A1* | 10/2014 | Jun ........................ | G02B 27/22 359/464 |
| 2015/0187750 | A1* | 7/2015 | Kim ..................... | H01L 27/0248 257/43 |

* cited by examiner

*Primary Examiner* — Thao P Le
(74) *Attorney, Agent, or Firm* — Birch, Stewart, Kolasch & Birch, LLP

(57) ABSTRACT

Discussed are an antistatic device of a display device, which has a high electrostatic discharge (ESD) speed and reduces consumption power, and a method of manufacturing the same. The antistatic device can include a first switching thin film transistor (TFT) in which an active layer is formed of oxide, a second switching TFT in which an active layer is formed of oxide, and an equalizer TFT in which an active layer is formed of amorphous silicon.

11 Claims, 12 Drawing Sheets

| Division | Electron mobility |
|---|---|
| amorphous silicon | 0.24 cm$^2$/V·s |
| oxide | 10~30 cm$^2$/V·s |

< switching TFT (oxide) >

< equalizer TFT (a-Si) >

ANTISTATIC DEVICE OF DISPLAY DEVICE AND METHOD OF MANUFACTURING THE SAME

CROSS-REFERENCE TO RELATED APPLICATIONS

This application claims the priority benefit of the Korean Patent Application No. 10-2013-0164464 filed on Dec. 26, 2013, which is hereby incorporated by reference as if fully set forth herein.

BACKGROUND OF THE INVENTION

1. Field of the Invention

The present invention relates to an antistatic device of a display device, which has a high electrostatic discharge (ESD) speed and reduces consumption power, and to a method of manufacturing the same.

2. Discussion of the Related Art

With the advance of various portable electronic devices such as mobile communication terminals, smart phones, tablet computers, notebook computers, etc., the demand for flat panel display (FPD) devices applicable to the portable electronic devices is increasing.

Liquid crystal display (LCD) devices, plasma display panels (PDPs), field emission display (FED) devices, light emitting diode display devices, organic light emitting display devices, etc. have been developed as the FPD devices.

FIG. 1 is a diagram schematically illustrating a general LCD device, and FIG. 2 is a diagram illustrating an equivalent circuit of a related art antistatic device.

Referring to FIGS. 1 and 2, the LCD device includes a liquid crystal panel 10, in which a plurality of pixels are arranged in a matrix type to display an image, and a driving circuit unit (not shown) which supplies a signal and power for driving the liquid crystal panel 10.

In the LCD device, when static electricity is generated and input to a pixel, an image is not properly displayed, and a pixel and a line can be damaged. Therefore, an antistatic device 20 is parallelly connected to an input end of a data line DL and an input end of a gate line GL.

When static electricity is generated, the antistatic device 20 disperses the static electricity to protect the pixels in an active area. When high-voltage static electricity is generated, the antistatic device 20 first senses an electrostatic signal, and since an insulating layer of each of a plurality of internal thin film transistors (TFTs) is damaged, the antistatic device 20 protects the pixels which are formed in the active area.

The antistatic device 20 of the related art includes two switching TFTs 22 and 24 and one equalizer TFT 26.

The first switching TFT 22 and the second switching TFT 24 operate as a diode because a gate is diode-connected to a source, and prevent a current from flowing in both directions.

In the antistatic device 20 of the related art, the first switching TFT 22, the second switching TFT 24, and the equalizer TFT 26 are all formed of one kind of active layer.

When each of the first switching TFT 22, the second switching TFT 24, and the equalizer TFT 26 is an oxide semiconductor TFT, an operation speed based on an inflow of static electricity is high. On the other hand, in the oxide semiconductor TFT, a large amount of current is leaked, and for this reason, consumption power increases.

When each of the first switching TFT 22, the second switching TFT 24, and the equalizer TFT 26 is a amorphous silicon (a-Si) TFT, the amount of a leakage current is small. On the other hand, in the a-Si TFT, a response time based on an inflow of static electricity is slow, and for this reason, the static electricity is not quickly prevented.

SUMMARY OF THE INVENTION

Accordingly, the present invention is directed to provide an antistatic device of a display device and a method of manufacturing the same that substantially obviate one or more problems due to limitations and disadvantages of the related art.

An aspect of the present invention is directed to provide an antistatic device in which electrostatic discharge (ESD) performance is enhanced by using a switching TFT which quickly responds to an electrostatic pulse.

Another aspect of the present invention is directed to provide an antistatic device in which consumption power is reduced by using an equalizer TFT where the amount of a leakage current is small.

Another aspect of the present invention is directed to provide a method of manufacturing an antistatic device including a switching TFT which quickly responds to an electrostatic pulse.

Another aspect of the present invention is directed to provide a method of manufacturing an antistatic device including an equalizer TFT where the amount of a leakage current is small.

In addition to the above-mentioned objects of the present invention, other features and advantages of the present invention will be described below, but will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an antistatic device of a display device, the antistatic device including in one example: a first switching thin film transistor (TFT) in which an active layer is formed of oxide; a second switching TFT in which an active layer is formed of oxide; and an equalizer TFT in which an active layer is formed of amorphous silicon.

In another aspect of the present invention, there is provided a method of manufacturing an antistatic device, which includes a plurality of switching thin film transistors (TFTs) and an equalizer TFT, including: forming a light shield with amorphous silicon, on a buffer layer which is formed on a substrate; forming a first gate insulating layer to cover the light shield; forming an active layer with oxide, in a switching TFT area on the first gate insulating layer; forming a second gate insulating layer to cover the active layer; forming a gate of each of the plurality of switching TFTs on the second gate insulating layer, and forming a gate of the equalizer TFT in an equalizer TFT area on the first gate insulating layer; forming an interlayer dielectric to cover the gate of each of the plurality of switching TFTs and the gate of the equalizer TFT; etching a portion of the interlayer dielectric to form a plurality of contact holes which expose a top of the active layer and a top of the light shield; forming a source and a drain of each of the plurality of switching TFTs to be connected to the active layer, and forming a source and a drain of the equalizer TFT to be connected to the light shield; and forming a passivation layer to cover the plurality of switching TFTs and the equalizer TFT.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
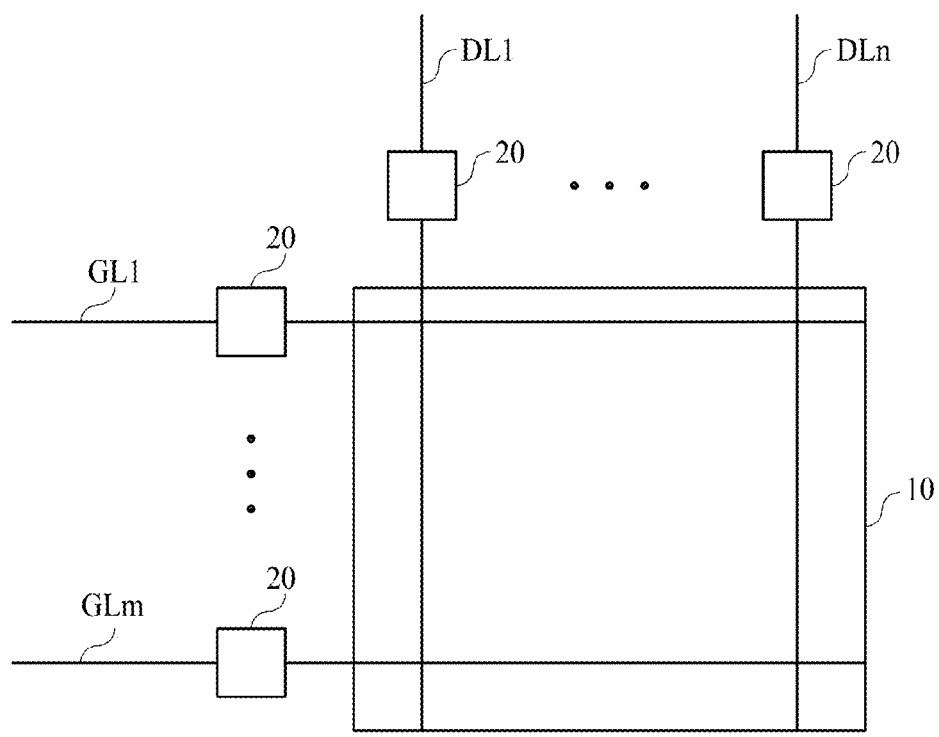
FIG. 1 is a diagram schematically illustrating a general LCD device.
Figure 2:
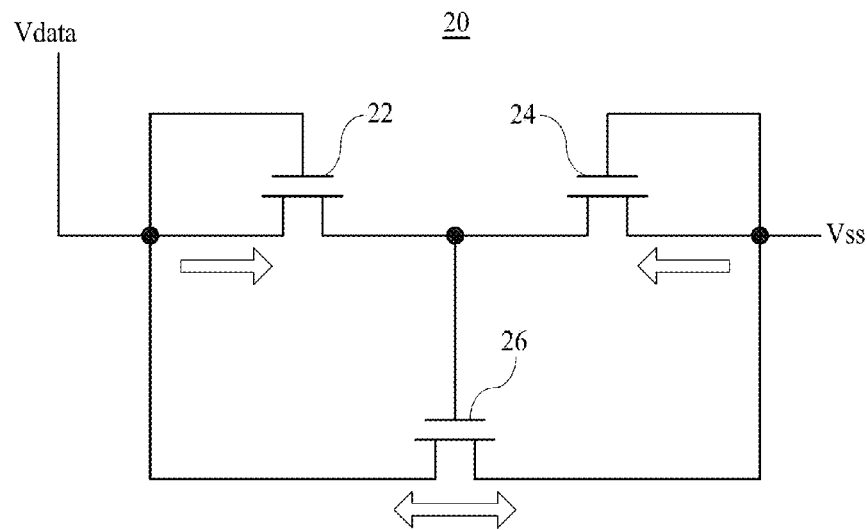
FIG. 2 is a diagram illustrating an equivalent circuit of a related art antistatic device.

Reference will now be made in detail to the exemplary embodiments of the present invention, examples of which are illustrated in the accompanying drawings. Wherever possible, the same reference numbers will be used throughout the drawings to refer to the same or like parts.

In the specification, in adding reference numerals for elements in each drawing, it should be noted that like reference numerals already used to denote like elements in other drawings are used for elements wherever possible.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms.

It should be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover a case where a third structure is disposed therebetween.

Terms "upper portion/lower portion" and "on/under" are for describing an LCD device with a built-in touch sensor and a method of manufacturing the same according to an embodiment of the present invention with reference to the drawings. Therefore, the terms "upper portion/lower portion" and "on/under" may differ in structure during a manufacturing process and after manufacturing is completed.

Hereinafter, an antistatic device according to embodiments of the present invention will be described in detail with reference to the accompanying drawings. The present invention provides an antistatic device, which includes a plurality of switching TFTs having a fast response time and an equalizer TFT where the amount of a leakage current is small, and a method of driving the same.

Figure 3:
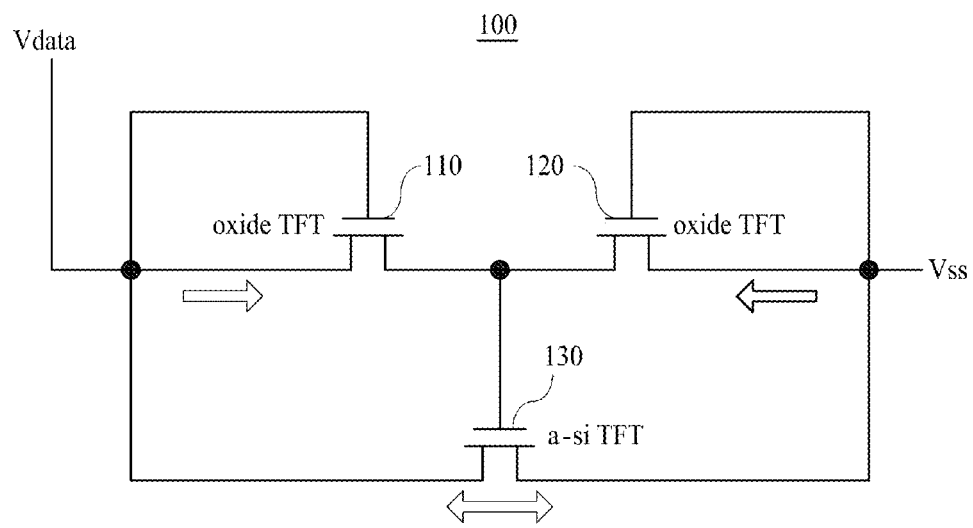
FIG. 3 is a diagram illustrating an equivalent circuit of an antistatic device according to an embodiment of the present invention.

FIG. 3 is a diagram illustrating an equivalent circuit of an antistatic device according to an embodiment of the present invention.

Referring to FIG. 3, an antistatic device 100 according to an embodiment of the present invention includes a first switching TFT 110, a second switching TFT 120, and an equalizer TFT 130. All the components of the antistatic device in this and other embodiments are operatively coupled and configured.

The first switching TFT 110 and the second switching TFT 120 operate as a diode because a gate is diode-connected to a source, and a current flows in only one direction.

Here, the first switching TFT 110 and the second switching TFT 120 are formed of an oxide semiconductor TFT having a fast response time of a signal so that the first switching TFT 110 and the second switching TFT 120 quickly respond to a pulse of static electricity when the static electricity flows into a line. Also, the equalizer TFT 130 is formed of a a-Si TFT which has a slower operation speed than that of the oxide semiconductor TFT, but has excellent leakage current characteristic.

A source of the first switching TFT 110 is connected to a data line to which a data voltage Vdata is applied, and a drain is connected to a drain of the second switching TFT 120 and a gate of the equalizer TFT 130.

A source of the second switching TFT 120 is connected to a low-level power source Vss, and a drain is connected to the drain of the first switching TFT 110 and a gate of the equalizer TFT 130.

A source of the equalizer TFT 130 is connected to the source of the first switching TFT 110, and a drain is connected to the source of the second switching TFT 120. A gate of the equalizer TFT 130 is connected to the drains of the first switching TFT 110 and the second switching TFT 120.

The first switching TFT 110, the second switching TFT 120, and the equalizer TFT 130 are turned off when a high voltage is not applied to the first switching TFT 110, the second switching TFT 120, and the equalizer TFT 130.

When a high voltage is applied to the first switching TFT 110, the first switching TFT 110 is turned on, and disperses the high voltage to a rear end (a terminal which is connected to the gate of the equalizer TFT 130). When the high voltage is applied to the second switching TFT 120, the second switching TFT 120 is turned on, and disperses the high voltage to a rear end (a terminal which is connected to the gate of the equalizer TFT 130).

The first switching TFT 110 and the second switching TFT 120 are turned on, and when a high voltage is applied to a terminal which is connected to the gate of the equalizer TFT 120, the equalizer TFT 130 is turned on. Therefore, the high voltage is dispersed to the sources of the first switching TFT 110 and the second switching TFT 120. That is, the equalizer TFT 130 disperses the high voltage, which is applied when the equalizer TFT 130 is turned on, in both directions. When the equalizer TFT 130 disperses the high voltage to a rear end (a terminal which is connected to the sources of the first switching TFT 110 and the second switching TFT 120), and the first switching TFT 110, the second switching TFT 120, and the equalizer TFT 130 are turned off In the antistatic device 100 according to an embodiment of the present invention, the first switching TFT 110 and the second switching TFT 120 are respectively disposed at both ends of the equalizer TFT 130. Therefore, positive (+) static electricity and negative (−) static electricity which are generated in a line are all discharged, and thus, high-voltage static electricity can be prevented from flowing into an active area.

Figure 4:
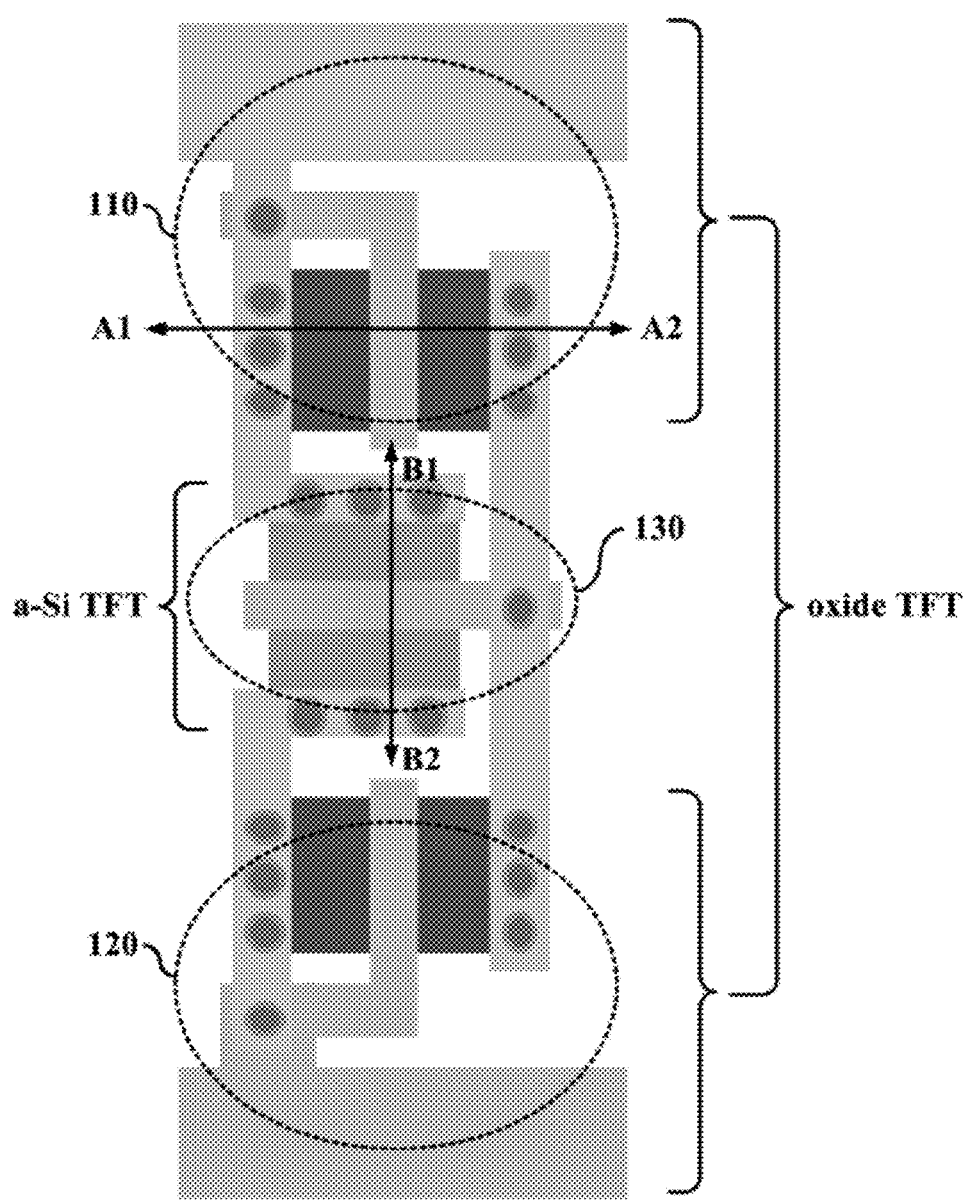
FIG. 4 is a diagram illustrating a plan layout of the antistatic device according to an embodiment of the present invention.
Figure 5:
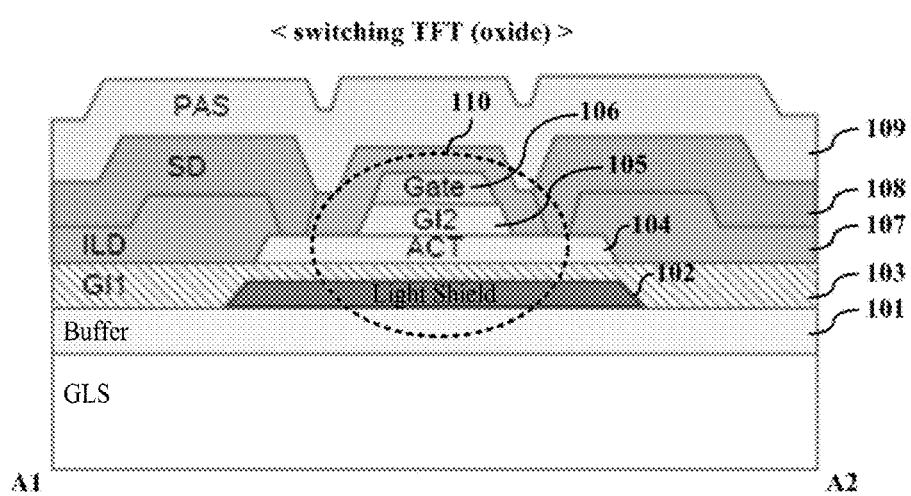
FIG. 5 is a cross-sectional view of a switching TFT taken along line A1-A2 of FIG. 4 and a cross-sectional view of an equalizer TFT taken along line B1-B2 of FIG. 4.
Figure 5:
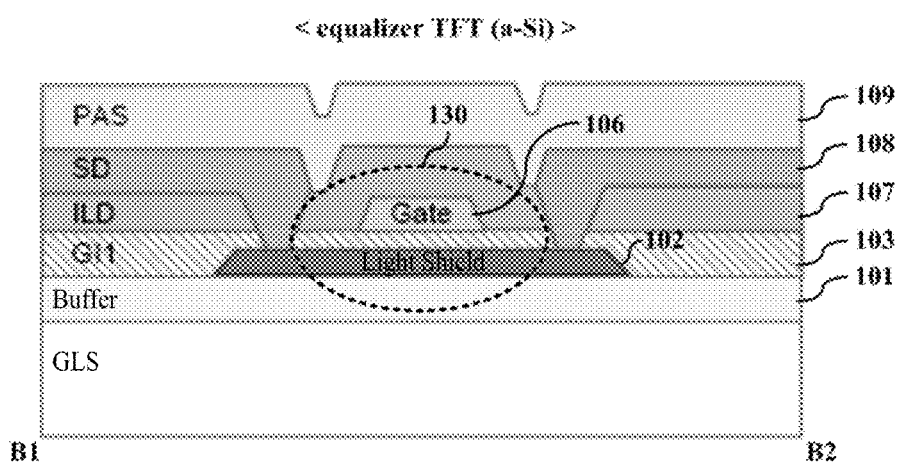

FIG. 4 is a diagram illustrating a plan layout of the antistatic device according to an embodiment of the present invention. FIG. 5 shows a cross-sectional view of a switching TFT taken along line A1-A2 of FIG. 4 and a cross-sectional view of an equalizer TFT taken along line B1-B2 of FIG. 4.

A structure of the first switching TFT 110 and a structure of the second switching TFT 120 will be described in detail with reference to FIGS. 4 and 5.

Switching TFT

The first switching TFT 110 and the second switching TFT 120 are formed in a top gate coplanar TFT structure. The first switching TFT 110 and the second switching TFT 120 have the same structure, and thus, the structure of the first switching TFT 110 will be described as an example.

A buffer layer 101 is formed on a substrate, and a light shield 102 is formed on the buffer layer 101. Here, the light shield 102 is formed of a-Si.

A first gate insulating layer (G11) 103 is formed to cover the light shield 102. In this case, the first gate insulating layer (G11) 103 may be formed to the same thickness as that of a gate insulating layer of a TFT which is formed in the active area.

Here, the first gate insulating layer (G11) 103 is formed of SiO$_2$ or SiNx to have a thickness of 1,000 Å to 1,500 Å. As another example, the first gate insulating layer (G11) 103 may be formed by depositing tetra ethyl ortho silicate (TEOS) or middle temperature oxide (MTO) in a chemical vapor deposition (CVD) process.

An active layer 104 is formed on the first gate insulating layer (G11) 103. The active layer 104 is formed in an area which overlaps the light shield 102.

Here, the active layer 104 is formed of an oxide semiconductor material such as indium zinc oxide (IZO) or indium gallium zinc oxide (IGZO). Also, the active layer 104 may be formed of metal oxide.

A second gate insulating layer (G12) 105 is formed on the active layer 104. In this case, the second gate insulating layer (G12) 105 is formed to have a thinner thickness as that of the gate insulating layer of the TFT which is formed in the active area. Therefore, the first switching TFT 110 and the second switching TFT 120 have a faster switching speed than that of a pixel TFT which is formed in the active area.

Here, the second gate insulating layer (G12) 105 is formed of SiO$_2$ or SiNx to have a thickness of 1,000 Å to 1,500 Å. As another example, the second gate insulating layer (G12) 105 may be formed by depositing TEOS or MTO in the CVD process.

A gate 106 is formed on the second gate insulating layer (G12) 105. An interlayer dielectric (ILD) 107 is formed to cover the gate 106. A portion of the interlayer dielectric 107 is etched to expose the active layer 104, thereby forming a contact hole of a source/drain.

A source/drain 108 connected to the active layer 104 is formed on the interlayer dielectric 107. A source S is formed at an upper one side of the interlayer dielectric 107 so as to be connected to the active layer 104. Also, a drain D is formed at the upper other side of the interlayer dielectric 107 so as to be connected to the active layer 104.

Here, the source/drain 108 may be formed of MoTi, but is not limited thereto. The source S and the drain D may be formed of aluminum (Al), silver (Ag), gold (Au), nickel (Ni), zirconium (Zr), cadmium (Cd), hafnium (Hf), tungsten (W), tantalum (Ta), or chromium (Cr), or may be formed of an alloy thereof As described above, the first switching TFT 110 is configured with the active layer 104, the second gate insulating layer (G12) 105, the source S, and the drain D. A passivation layer (PAS) 109 is formed to cover the first switching TFT 110.

Equalizer TFT

Next, a structure of the equalizer TFT 130 will be described in detail.

A buffer layer 101 is formed on a substrate, and a light shield 102 is formed on the buffer layer 101.

Here, the light shield 102 is formed of a-Si. The equalizer TFT 130 uses the light shield 102, which is formed of a-Si, as an active layer.

A first gate insulating layer (G11) 103 is formed to cover the light shield 102.

Here, the first gate insulating layer (G11) 103 is formed of SiO$_2$ or SiNx to have a thickness of 1,000 Å to 1,500 Å. As another example, the first gate insulating layer (G11) 103 may be formed by depositing TEOS or MTO in the CVD process.

A gate 106 is formed on the first gate insulating layer (G11) 103. An interlayer dielectric (ILD) 107 is formed to cover the gate 106. A portion of the interlayer dielectric 107 is etched to expose the active layer 104, thereby forming a contact hole of a source/drain.

A source/drain 108 connected to the active layer 104 is formed on the interlayer dielectric 107. A source S is formed at an upper one side of the interlayer dielectric 107 so as to be connected to the active layer 104. Also, a drain D is formed at the upper other side of the interlayer dielectric 107 so as to be connected to the active layer 104.

Here, the source/drain 108 may be formed of MoTi, but is not limited thereto. The source S and the drain D may be formed of aluminum (Al), silver (Ag), gold (Au), nickel (Ni), zirconium (Zr), cadmium (Cd), hafnium (Hf), tungsten (W), tantalum (Ta), or chromium (Cr), or may be formed of an alloy thereof As described above, the equalizer TFT 130 is configured with the light shield 102 which is formed of a-Si and is used as the active layer, the first gate insulating layer (G11) 103, the source S, and the drain D. A passivation layer (PAS) 109 is formed to cover the first switching TFT 110.

Figures 6, 7:
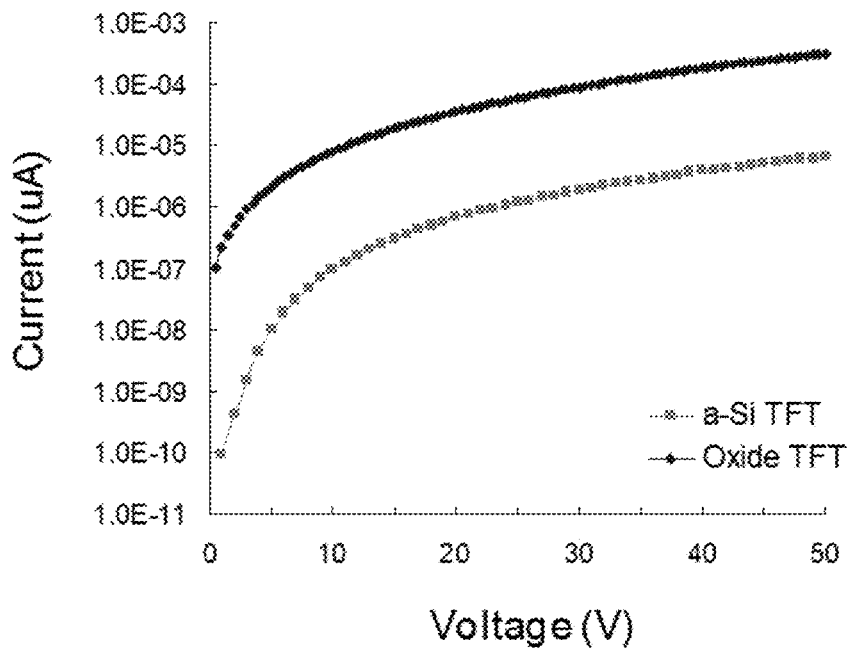
FIG. 6 is a diagram showing a direct current (DC) characteristic of each of a a-Si TFT and an oxide TFT according to one example of the present invention.
FIG. 7 is a diagram showing an electron mobility characteristic of each of the a-Si TFT and the oxide TFT according to one example of the present invention.

FIG. 6 is a diagram showing a direct current (DC) characteristic of each of a a-Si TFT and an oxide TFT according to one example of the present invention, and FIG. 7 is a diagram showing an electron mobility characteristic of each of the a-Si TFT and the oxide TFT according to one example of the present invention.

Referring to FIGS. 6 and 7, a-Si TFT has an electron mobility of 0.24 cm$^2$V·s, and is slow. However, the amount of a leakage current of the a-Si TFT is small.

On the other hand, an oxide TFT has an electron mobility of 10 to 30 cm²V·s, and is fast. However, the amount of a leakage current of the oxide TFT is large.

In the antistatic device according to an embodiment of the present invention, the active layers of the first and second switching TFTs 110 and 120 and the active layer of the equalizer TFT 130 use different materials (i.e., oxide and a-Si) and thus, a current based on static electricity can be efficiently avoided.

In the antistatic device according to an embodiment of the present invention, an oxide semiconductor is applied to the active layers of the first and second switching TFTs 110 and 120, and thus, the first and second switching TFTs 110 and 120 quickly respond to an electrostatic pulse. Also, a-Si having excellent leakage current characteristic is applied to the active layer of the equalizer TFT 130.

That is, the first and second switching TFTs 110 and 120 which should sensitively respond to an electrostatic pulse are formed of an oxide TFT having a fast operation speed, and thus, ESD performance is enhanced. Also, the equalizer TFT 130 which needs a small amount of leakage current is formed of a a-Si TFT, and thus, consumption power can be reduced.

FIGS. 8 to 14 are diagrams illustrating an antistatic device according to an embodiment of the present invention.

Figure 8:
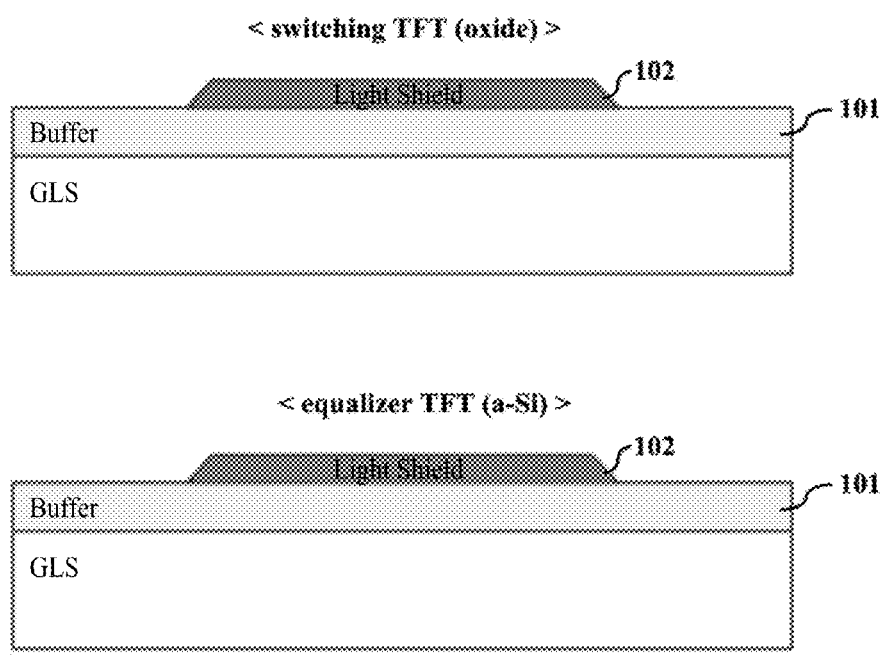
FIGS. 8 to 14 are diagrams illustrating an antistatic device according to an embodiment of the present invention.

Referring to FIG. 8, a buffer layer 101 is formed on a substrate, and a-Si is deposited on the buffer layer 101.

Subsequently, the deposited a-Si is patterned by performing a photolithography process and an etching process which use a first mask. By patterning a-Si, a light shield 102 is formed in a switching TFT area and an equalizer TFT area.

Figure 9:
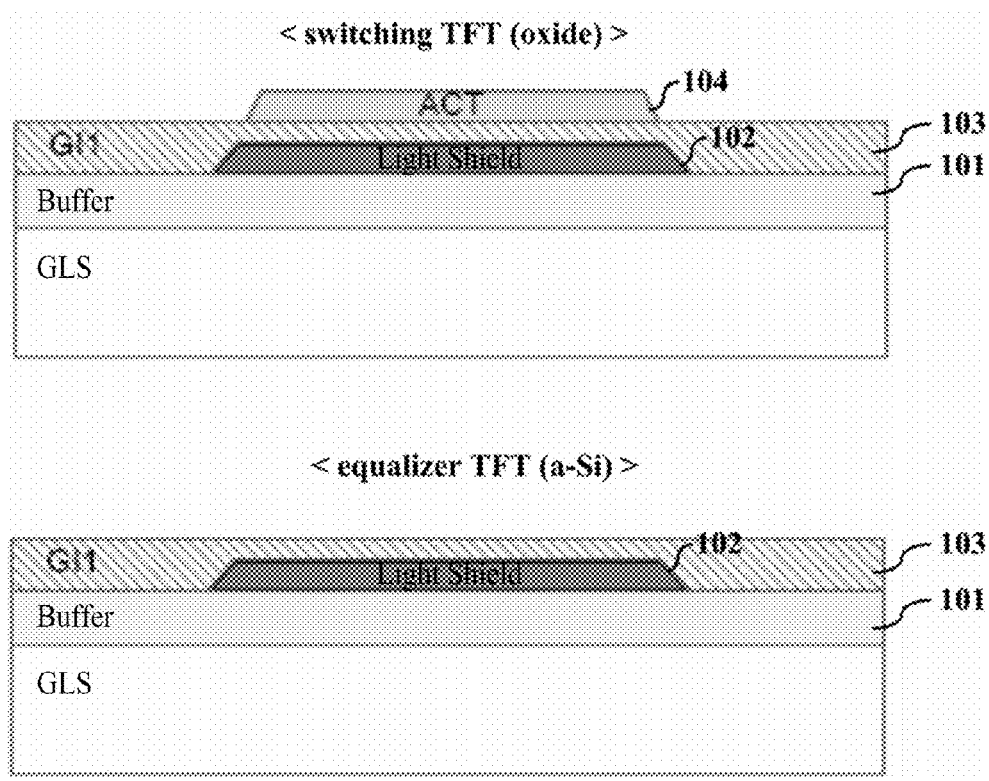

Subsequently, referring to FIG. 9, a first gate insulating layer (G11) 103 is formed to cover the light shield 102 which is formed in the switching TFT area and the equalizer TFT area.

Here, the first gate insulating layer (G11) 103 is formed of SiO₂ or SiNx to have a thickness of 1,000 Å to 1,500 Å. As another example, the first gate insulating layer (G11) 103 may be formed by depositing TEOS or MTO in the CVD process.

Subsequently, an active layer 104 is formed in the switching TFT area on the first gate insulating layer (G11) 103. The active layer 104 is formed in an area which overlaps the light shield 102.

Here, the active layer 104 is formed of an oxide semiconductor material such as indium zinc oxide (IZO) or indium gallium zinc oxide (IGZO). Also, the active layer 104 may be formed of metal oxide.

An oxide semiconductor material is deposited on the first gate insulating layer (G11) 103, and then, the active layer 104 is formed by performing a photolithography process and an etching process which use a second mask.

Figure 10:
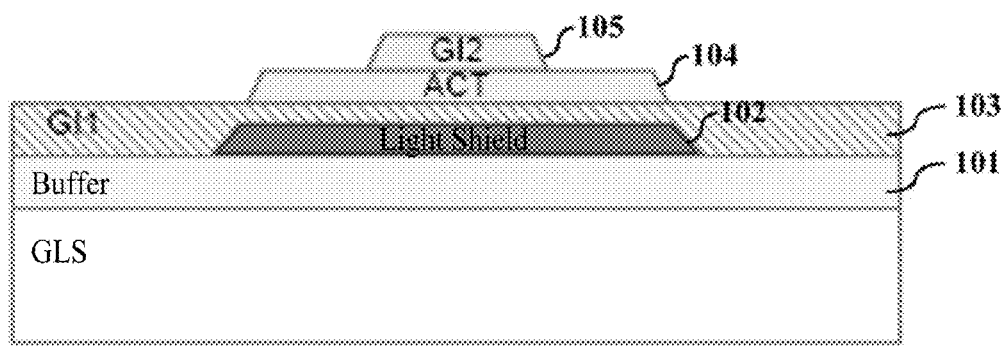
Figure 10:
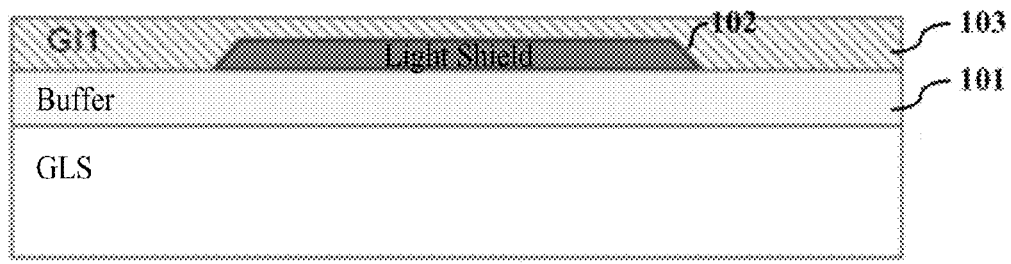

Subsequently, referring to FIG. 10, SiO₂ or SiNx is coated all over a substrate, and then, by performing a photolithography process and an etching process which use a third mask, a second gate insulating layer (G12) 105 is formed on the active layer 104 in the switching TFT area.

As another example, the second gate insulating layer (G12) 105 may be formed by depositing TEOS or MTO in the CVD process.

Figure 11:
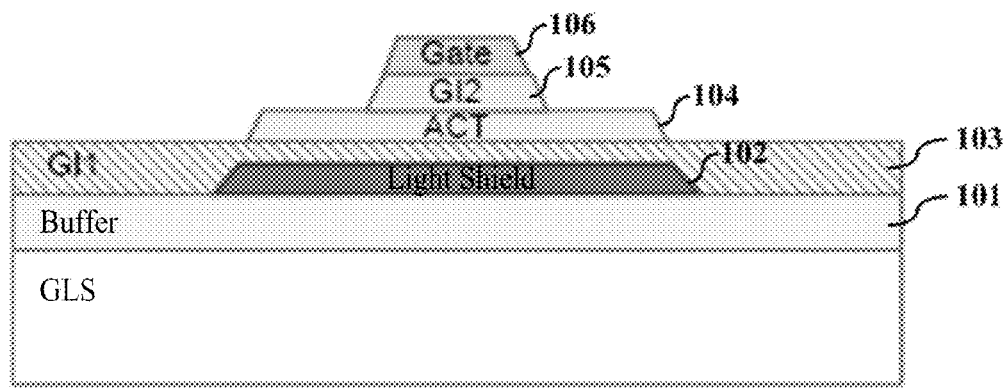
Figure 11:
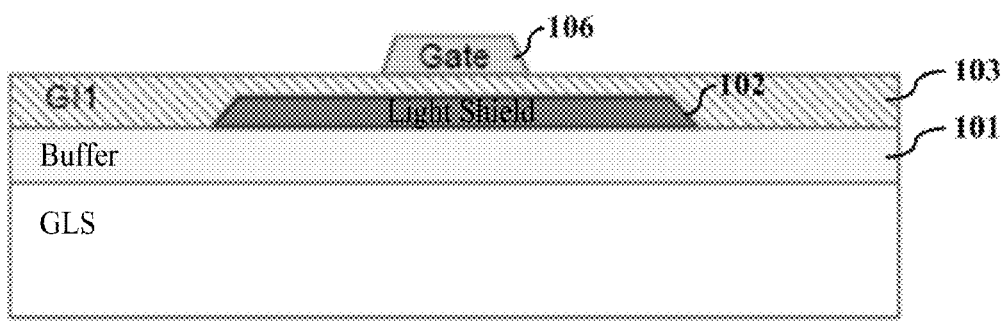

Referring to FIG. 11, a gate 106 is formed on the second gate insulating layer (G12) 105 in the switching TFT area. Simultaneously, a gate 106 is formed on the first gate insulating layer (G11) 106 of the equalizer TFT.

A metal material such as aluminum (Al), silver (Ag), gold (Au), nickel (Ni), zirconium (Zr), cadmium (Cd), hafnium (Hf), tungsten (W), tantalum (Ta), or chromium (Cr) is coated all over a substrate, and then, by performing a photolithography process and an etching process which use a fourth mask, a gate 106 is formed in the switching TFT area and the equalizer TFT area.

Figure 12:
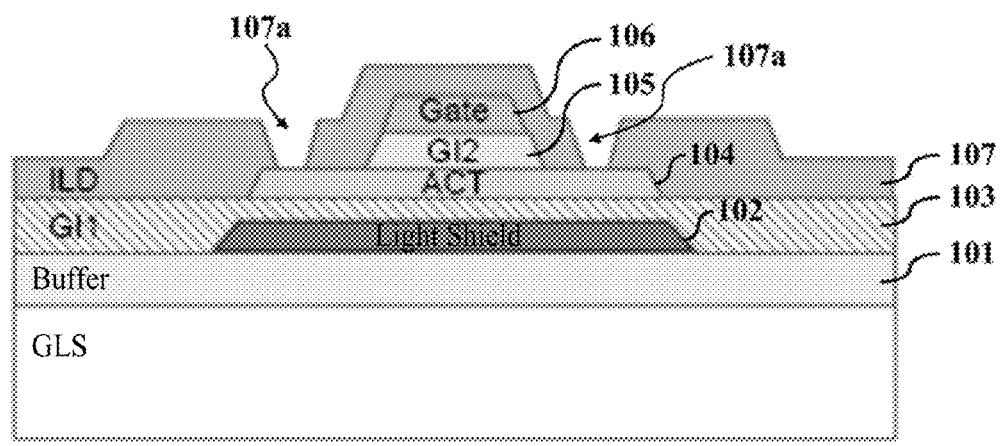
Figure 12:
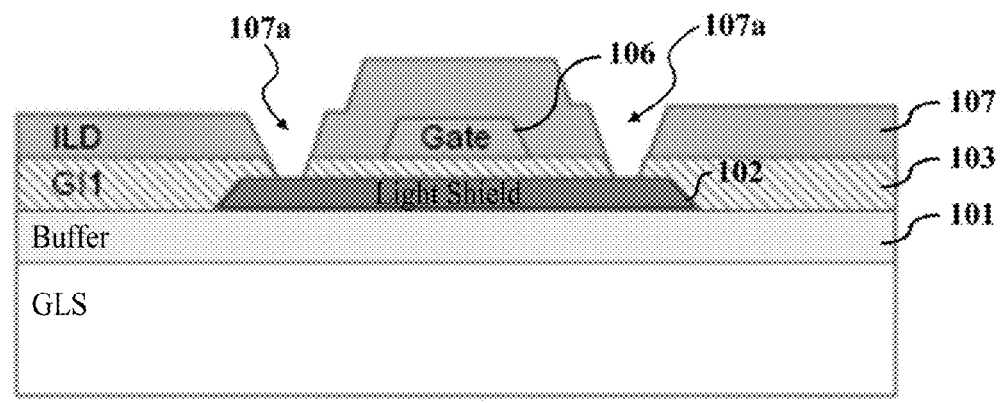

Referring to FIG. 12, an interlayer dielectric 107 is formed to cover the gate 106 which is formed in the switching TFT area and the equalizer TFT area.

By performing a photolithography process and an etching process which use a fifth mask, a portion of the interlayer dielectric 107 is etched to expose a top of the active layer 104 in the switching TFT area, thereby forming a contact hole 107a of a source/drain.

Simultaneously, a portion of the interlayer dielectric 107 is etched to expose a top of the light shield 102 in the equalizer TFT area, thereby forming a contact hole 107a of a source/drain.

Figure 13:
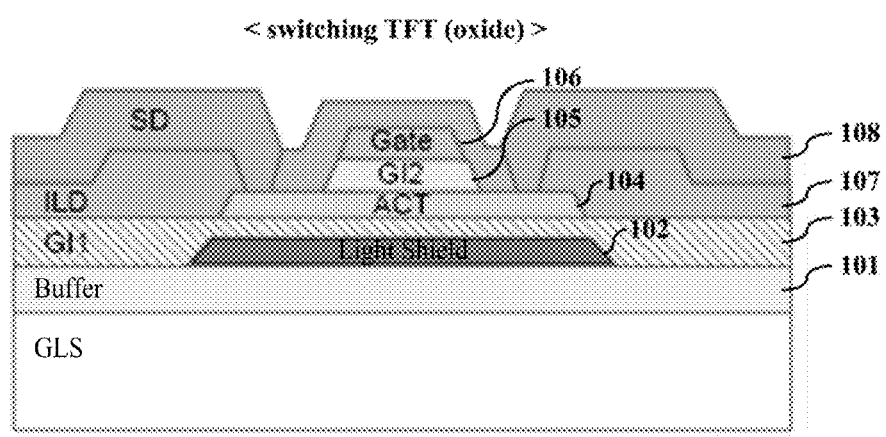
Figure 13:
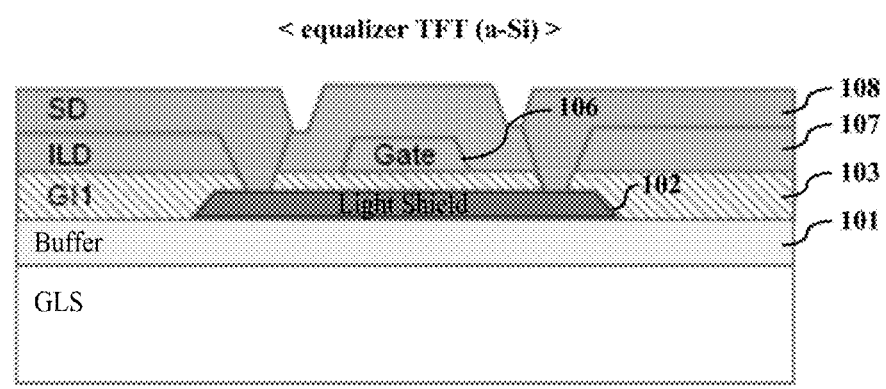

Subsequently, referring to FIG. 13, a source/drain 108 connected to the active layer 104 is formed on the interlayer dielectric 107.

A conductive metal material is coated all over the substrate, and then, by performing a photolithography process and an etching process which use a sixth mask, a source S connected to the active layer 104 is formed at an upper one side of the interlayer dielectric 107. Also, a drain D connected to the active layer 104 is formed at the upper other side of the interlayer dielectric 107.

Simultaneously, by performing the photolithography process and the etching process which use a sixth mask, a source S connected to the light shield 102 is formed at an upper one side of the interlayer dielectric 107. Also, a drain D connected to the light shield 102 is formed at the upper other side of the interlayer dielectric 107.

Here, the source S and the drain D may be formed of MoTi, but is not limited thereto. The source S and the drain D may be formed of aluminum (Al), silver (Ag), gold (Au), nickel (Ni), zirconium (Zr), cadmium (Cd), hafnium (Hf), tungsten (W), tantalum (Ta), or chromium (Cr), or may be formed of an alloy thereof As described above, the first switching TFT 110 is configured with the active layer 104 formed of an oxide semiconductor material, the second gate insulating layer (G12) 105, the source S, and the drain D.

The equalizer TFT 130 is configured with the light shield 102 which is formed of a-Si and is used as the active layer, the first gate insulating layer (G11) 103, the source S, and the drain D.

Figure 14:
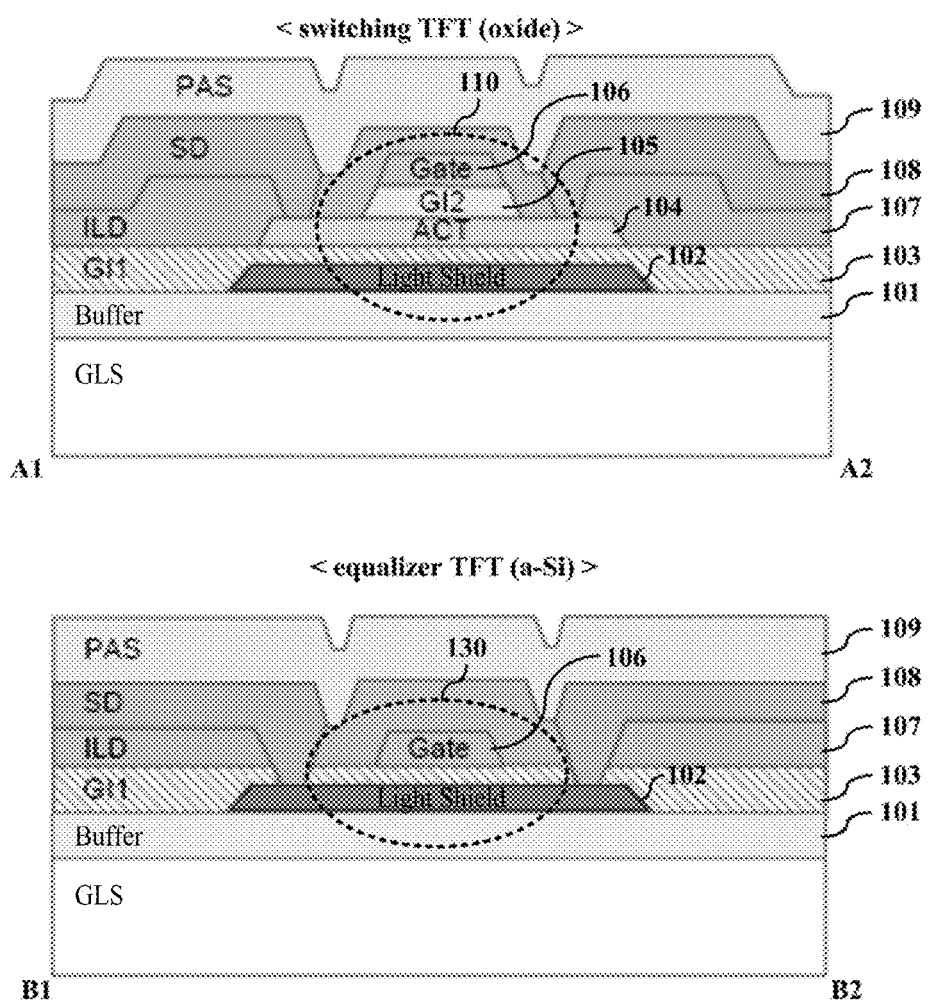

Subsequently, referring to FIG. 14, a passivation layer (PAS) 109 is formed to cover the first switching TFT 110 and the equalizer TFT 130.

In the above-described method of manufacturing the antistatic device according to an embodiment of the present invention, a thickness of the insulating layer of each of the first and second switching TFTs 110 and 120 differs from that of the insulating layer of the equalizer TFT 130, and thus, a switching characteristic of the first and second switching TFTs 110 and 120 differs from a switching characteristic of the equalizer TFT 130. That is, a switching speed of the first and second switching TFTs 110 and 120 differs from a switching speed of the equalizer TFT 130.

Hereinabove, it has been described that the first switching TFT 110, the second switching TFT 120, and the equalizer TFT 130 are simultaneously formed by the same manufacturing process.

However, the present invention is not limited thereto. For example, the first and second switching TFTs 110 and 120 may be first formed, and by performing a subsequent process, the equalizer TFT 130 may be formed between the first and second switching TFTs 110 and 120.

The antistatic device is disposed at input ends of a data line and a gate line of a display panel, and thus, static electricity which is a high voltage equal to or higher than a rated voltage and flows to a line is discharged. In this case, the antistatic device may be configured with two diodes and one equalizer TFT.

In the above-described method of manufacturing the antistatic device according to an embodiment of the present invention, the active layers of the first and second switching TFTs 110 and 120 are formed of an oxide semiconductor, and thus, ESD performance can be enhanced. Also, the light shield 102 formed of a-Si is formed as the active layer of the equalizer TFT 130, and thus, consumption power can be reduced.

The antistatic device according to the embodiments of the present invention includes the switching TFT which quickly responds to the electrostatic pulse, and thus, ESD performance is enhanced.

The antistatic device according to the embodiments of the present invention includes the equalizer TFT where the amount of a leakage current is small, and thus, consumption power is reduced. Further, the antistatic device according to one or more embodiments of the present invention can be used in any electronic devices such as in display device, e.g., in LCD devices. For example, each antistatic device 20 in the general display device of FIG. 1 may be replaced with the antistatic device 100 of the present invention.

The method of manufacturing the antistatic device according to the embodiments of the present invention manufactures the switching TFT which quickly responds to the electrostatic pulse.

The method of manufacturing the antistatic device according to the embodiments of the present invention manufactures the equalizer TFT where the amount of a leakage current is small.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An antistatic device for a display device, the antistatic device comprising:
   a first switching thin film transistor (TFT) in which an active layer is formed of oxide;
   a second switching TFT in which an active layer is formed of oxide; and
   an equalizer TFT in which an active layer is formed of amorphous silicon.

2. The antistatic device of claim 1, wherein a thickness of a gate insulating layer of each of the first and second switching TFTs differs from a thickness of a gate insulating layer of the equalizer TFT.

3. The antistatic device of claim 1, wherein a switching speed of each of the first and second switching TFTs differs from a switching speed of the equalizer TFT.

4. The antistatic device of claim 1, wherein the equalizer TFT comprises:
   a light shield formed of amorphous silicon, and used as an active layer;
   a first gate insulating layer formed on the light shield;
   a source connected to one side of the light shield; and
   a drain connected to the another side of the light shield.

5. The antistatic device of claim 1, wherein each of the first and second switching TFTs comprises:
   an active layer formed of oxide;
   a second gate insulating layer formed on the active layer;
   a source connected to one side of the active layer; and
   a drain connected to another side of the active layer.

6. The antistatic device of claim 1, wherein,
   a gate and a source of each of the first and second switching TFTs are connected to each other, and each of the first and second switching TFTs operates as a diode,
   drains of the first and second switching TFTs are connected to a gate of the equalizer TFT,
   a source of the equalizer TFT is connected to the source of the first switching TFT, and
   a drain of the equalizer TFT is connected to the source of the second switching TFT.

7. A display device comprising:
   a display panel configured to display images and including a plurality of gate lines, a plurality of data lines and a plurality of pixels; and
   the antistatic device of claim 1, connected to an input end of at least one of the data lines and to an input end of at least one of the gate lines.

8. A method of manufacturing an antistatic device including a plurality of switching thin film transistors (TFTs) and an equalizer TFT, the method comprising:
   forming a light shield with amorphous silicon, on a buffer layer which is formed on a substrate;
   forming a first gate insulating layer to cover the light shield;
   forming an active layer with oxide, in a switching TFT area on the first gate insulating layer;
   forming a second gate insulating layer to cover the active layer;
   forming a gate of each of the plurality of switching TFTs on the second gate insulating layer, and forming a gate of the equalizer TFT in an equalizer TFT area on the first gate insulating layer;
   forming an interlayer dielectric to cover the gate of each of the plurality of switching TFTs and the gate of the equalizer TFT;
   etching a portion of the interlayer dielectric to form a plurality of contact holes which expose a top of the active layer and a top of the light shield;
   forming a source and a drain of each of the plurality of switching TFTs to be connected to the active layer, and forming a source and a drain of the equalizer TFT to be connected to the light shield; and
   forming a passivation layer to cover the plurality of switching TFTs and the equalizer TFT.

9. The method of claim 8, wherein the light shield is formed as an active layer of the equalizer TFT.

10. The method of claim 8, wherein a thickness of the first gate insulating layer differs from a thickness of the second gate insulating layer.

11. The method of claim 8, wherein the second gate insulating layer of each of the plurality of switching TFTs is thinner in thickness than a gate insulating layer of a TFT which is formed in an active area of a display panel.

* * * * *